(12) United States Patent
Takeda

(10) Patent No.: US 8,344,461 B2
(45) Date of Patent: Jan. 1, 2013

(54) SOLID-STATE IMAGING DEVICE AND MANUFACTURING METHOD FOR THE SAME

(75) Inventor: Tomotsugu Takeda, Toyama (JP)

(73) Assignee: Panasonic Corporation, Osaka (JP)

( * ) Notice: Subject to any disclaimer, the term of this patent is extended or adjusted under 35 U.S.C. 154(b) by 192 days.

(21) Appl. No.: 12/893,565

(22) Filed: Sep. 29, 2010

(65) Prior Publication Data

US 2011/0073971 A1 Mar. 31, 2011

(30) Foreign Application Priority Data

Sep. 29, 2009 (JP) .................................. 2009-223755

(51) Int. Cl.
*H01L 21/02* (2006.01)

(52) U.S. Cl. . 257/382; 257/754; 257/755; 257/E29.156; 438/630; 438/721

(58) Field of Classification Search .................. None
See application file for complete search history.

(56) References Cited

U.S. PATENT DOCUMENTS

| 5,447,875 | A | 9/1995 | Moslehi |
|---|---|---|---|
| 6,277,739 | B1 * | 8/2001 | Tseng ........................... 438/655 |
| 7,342,269 | B1 | 3/2008 | Yuzurihara |
| 2001/0052648 | A1 | 12/2001 | Sakurai et al. |
| 2002/0096726 | A1 | 7/2002 | Koike |
| 2004/0155297 | A1 * | 8/2004 | Ariyoshi et al. ............... 257/377 |
| 2005/0151175 | A1 * | 7/2005 | Ohkawa ........................ 257/292 |
| 2008/0124915 | A1 | 5/2008 | Yamaguchi |

FOREIGN PATENT DOCUMENTS

JP 2003-022985 1/2003

* cited by examiner

*Primary Examiner* — Benjamin Sandvik
*Assistant Examiner* — Scott R Wilson
(74) *Attorney, Agent, or Firm* — McDermott Will & Emery LLP

(57) ABSTRACT

A MOS solid-state imaging device having: a semiconductor substrate provided with a pair of source and drain regions in a pixel area, the pair of source and drain regions constituting part of a transistor in the pixel area; an insulating film formed over the semiconductor substrate; a wiring layer formed over the insulating film; and a contact plug penetrating through the insulating film to connect either one of the pair of source and drain regions with the wiring layer, wherein a surface area of said one of the pair of source and drain regions is silicided, the surface area contacting with the contact plug, and a width of the surface area is equal to a width of the contact plug.

3 Claims, 7 Drawing Sheets

SOLID-STATE IMAGING DEVICE AND MANUFACTURING METHOD FOR THE SAME

The disclosure of Japanese Patent Application No. 2009-223755 filed Sep. 29, 2009 including specification, drawings and claims is incorporated herein by reference in its entirety.

TECHNICAL FIELD

The present invention relates to a solid-state imaging device and a manufacturing method for the same, and in particular to the structure of the pixel area of a MOS (Metal Oxide Semiconductor) solid-state imaging device.

BACKGROUND ART

MOS solid-state imaging devices are commonly used in digital still cameras and digital video cameras. A semiconductor substrate of a MOS solid-state imaging device has a pixel area and a peripheral circuit area. The pixel area includes a plurality of pixels arranged in a matrix. The peripheral circuit area includes a peripheral circuit for reading signals from the pixels in the pixel area. In the MOS solid-state imaging device, a plurality of transistors are provided respectively for the pixels in the pixel area. The following describes the structure of the imaging device in detail, focusing only on one of the transistors in the pixel area. The pixel area of the semiconductor substrate is provided with source regions and drain regions. A wiring layer is formed over the semiconductor substrate so as to sandwich an insulating film therebetween. Also, a plurality of contact plugs penetrating the insulating film are formed. The contact plugs connect the wiring layer with each of the source and drain regions of the transistor in the pixel area.

Next, procedures for forming the contact plugs are described. First, after the source and drain regions of the transistor are formed in the pixel area of the semiconductor substrate, a metal film is formed over the semiconductor substrate. After that, the semiconductor substrate is subjected to heat treatment, so that the surfaces of the source and drain regions of the transistor is silicided (Hereinafter, the silicided area is called "silicide film"). After the heat treatment, the residue of the metal film, which is left unsilicided, is removed, and then the insulating film is formed over the semiconductor substrate. Afterwards, contact holes are formed by removing the part of the insulating film that covers the source and drain regions of the transistor, specifically by an etching method. Finally, a conductive material is implanted in each contact hole, whereby the contact plugs are formed on the silicide film.

As described above, in the procedures for forming the contract plugs, the source and drain regions of the transistor, which are to be in contact with one ends of the contact plugs, are silicide so that the contact resistance is reduced. This allows the MOS solid-state imaging device to operate at a high speed. As conventional technology relating to procedures for forming contract plugs, Patent Literature 1 discloses one technique.

CITATION LIST

Patent Literature

Patent Literature 1
Japanese Patent Application Publication No. 2003-22985

SUMMARY OF INVENTION

Technical Problem

According to the procedures for forming as stated above, the silicide film is formed over the surfaces of the source and drain regions in advance to the formation of the contact hole, and the silicide film is formed to be wider than the contact hole. This is in view of possible variations through the manufacturing process. The silicide film is provided with a margin, in order that the contact hole can be surely formed on the silicide film even if misalignment of the contact holes occurs.

Meanwhile, in line with the recent increase in the number of pixels in the pixel, the source and drain regions formed in the pixel area of the semiconductor substrate are decreasing in size.

Thus, if a silicide film with a margin is formed by silicidation of the surface of an n-type source region formed in a p-type semiconductor substrate, the silicide film and the p-type semiconductor substrate, sandwiching the n-type source region, would be very close from each other.

Here, in some cases, silicide spikes are formed in the formation of a silicide film. Note that the term "silicide spikes" refers to spike-shaped protrusions from the silicide film, formed through partial abnormal growth of the silicide film.

If silicide spikes are formed in the case where a silicide film and a p-type semiconductor substrate are very close, there is a risk that the silicide spikes penetrate the n-type source region to reach the p-type semiconductor substrate. This increases leakage current from p-n junctions. The increase of the leakage current in the pixel area leads to deterioration of the image quality. For example, it can be a cause of misdetection of electrons when there is no light incident on the photodiode and thus no electron. Such a phenomenon is known as "white spots".

In the description above, only one of the transistors on the pixel area is explained. However, all the other transistors in the pixel area have the same problem, because with respect to all the other transistors, the silicide film is formed before the formation of the contact holes, on the source regions and the drain regions.

The present invention aims to provide a solid-state imaging device that is capable of obtaining high-quality images while reducing the contact resistance in the pixel area.

Solution To Problem

In order to solve the above problems, the present invention provides a MOS solid-state imaging device comprising: a semiconductor substrate provided with a pair of source and drain regions in a pixel area thereof, the pair of source and drain regions constituting part of a transistor in the pixel area; an insulating film formed over the semiconductor substrate; a wiring layer formed over the insulating film; and a contact plug penetrating through the insulating film to connect either one of the pair of source and drain regions with the wiring layer, wherein a surface area of said one of the pair of source and drain regions is silicided, the surface area contacting with the contact plug, and a width of the surface area is equal to a width of the contact plug.

Advantageous Effects of Invention

According to the present invention, the width of the silicided area that is on said one of the pair of source and drain regions and contacts with the contact plug, is the same as the width of the contact plug. Thus, the width of the silicided area can be minimized within the range maintaining the effect of the reduction of the contact resistance.

Even if silicide spikes are formed in the silicided area, such a structure reduces the risk that the silicide spikes penetrate the side surface of the layer where the silicide spikes are formed.

As a result, the increase of the leakage current in the pixel area is suppressed, resulting in a high image quality.

As described above, the solid-state imaging device pertaining to an embodiment of the present invention suppresses the increase of the leakage current and the contact resistance in the pixel area, at the same time.

DESCRIPTION OF EMBODIMENTS

1. First Embodiment 1-1. Overall Structure of Solid-state Imaging Device

Figure 1:
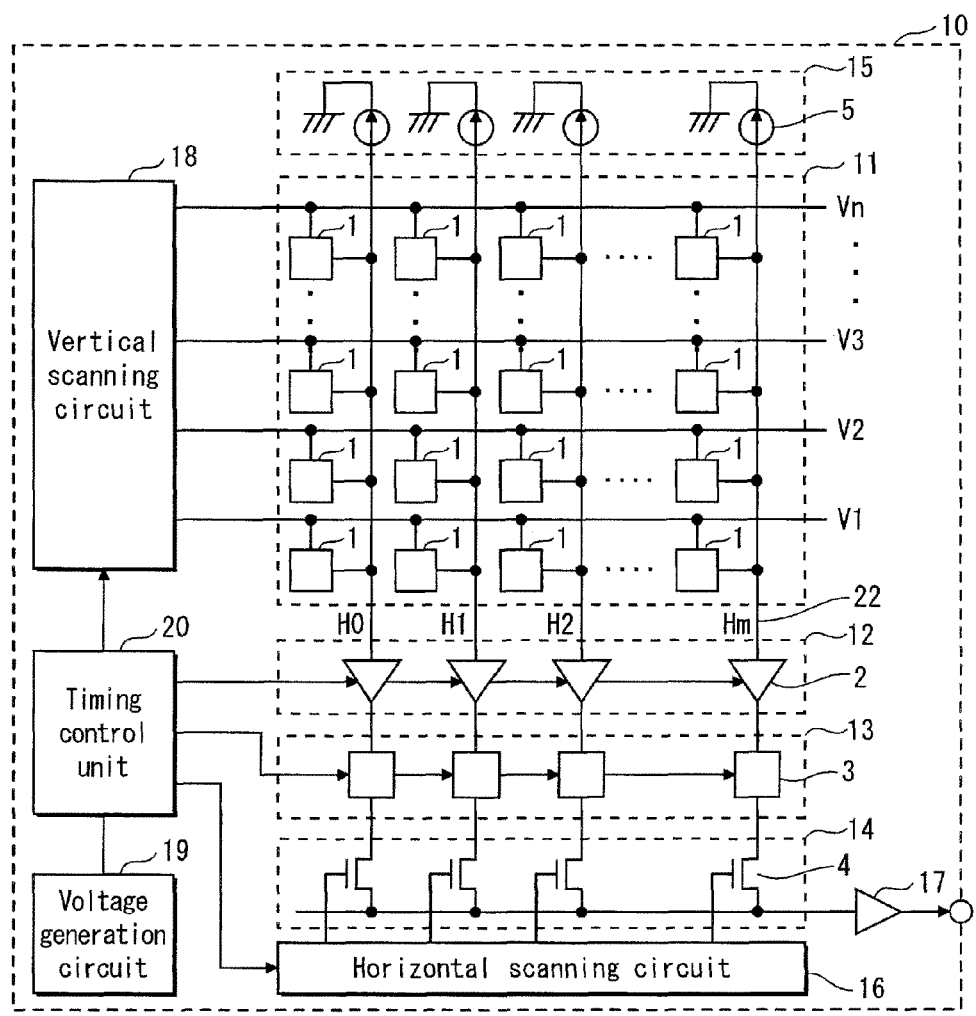
FIG. 1 schematically shows the structure of a solid-state imaging device pertaining to the first embodiment.

The following describes a solid-state imaging device pertaining to the first embodiment of the present invention. FIG. 1 schematically shows the structure of a solid-state imaging device pertaining to the first embodiment. As shown in FIG. 1, a solid-state imaging device 10 is a MOS solid-state imaging device, and has a pixel area 11 and a peripheral circuit area disposed around the pixel area 11. The peripheral circuit area includes column amplifiers 12, noise cancellation circuits 13, a multiplexer 14, load circuits 15, a horizontal scanning circuit 16, an output amplifier 17, a vertical scanning circuit 18, a voltage generation circuit 19, and a timing control unit 20.

The pixel area 11 includes a plurality of pixels 1 arranged in a matrix, and a column amplifier 2, a noise cancellation circuit 3, a switch element 4, and a load circuit 5 are provided for each column of the pixel area 11.

The pixels 1 included in the pixel area 11 are reset, charged, and read row by row, by operations of the vertical scanning circuit 18. Pixel signals read from each row of pixels are amplified by the column amplifiers 2 each provided for a different one of columns, and retained by the noise cancellation circuit 3 upon offset variation of the amplifiers being cancelled by the noise cancellation circuit 3. The pixel signals corresponding to one row of pixels retained by the noise cancellation circuit 3 are sequentially outputted via the multiplexer 14 and the output amplifier 17 by operations of the horizontal scanning circuit 16.

The voltage generation circuit 19 generates various voltages necessary for circuits in the solid-state imaging device 10.

The timing control unit 20 synchronizes and drives the circuits in the solid-state imaging device 10.

1-1-1. Circuit Structure of Solid-State Imaging Device

Figure 2:
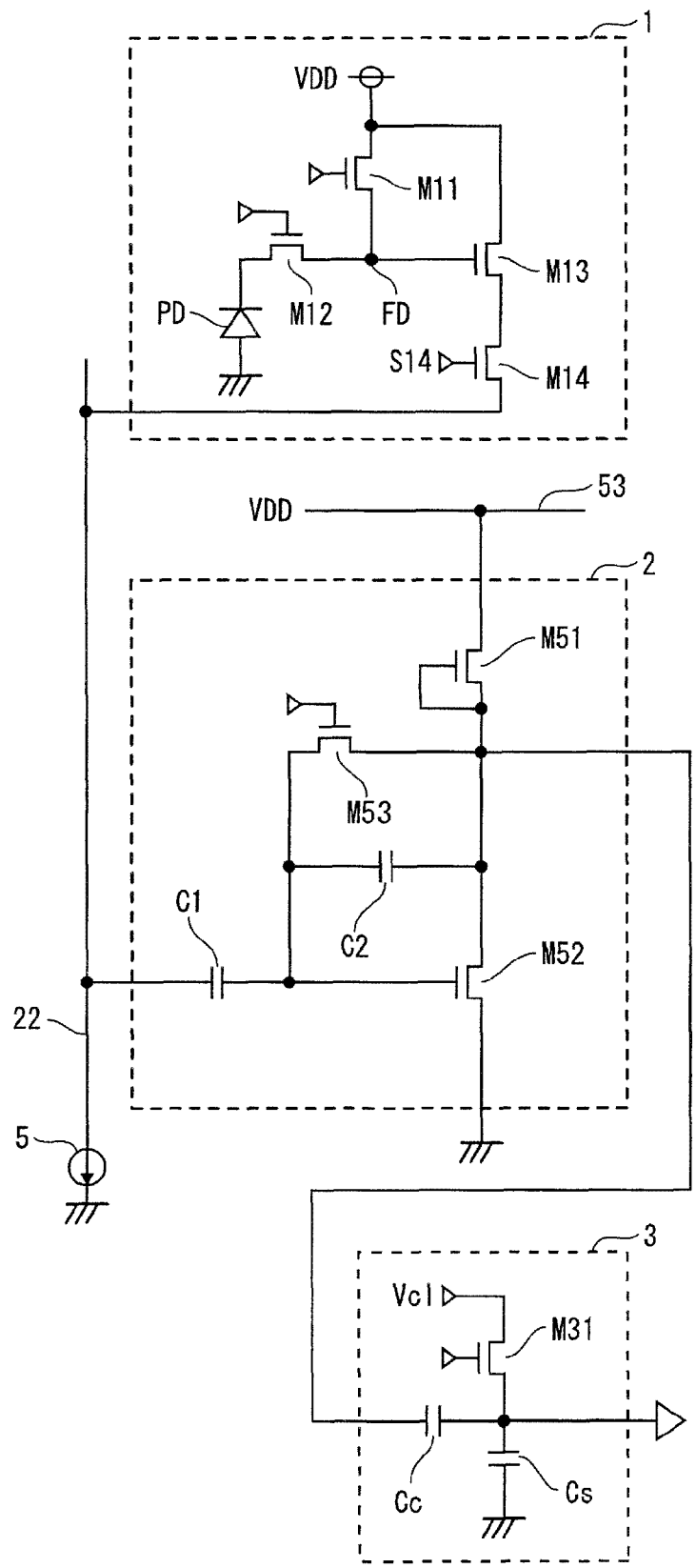
FIG. 2 is a circuit diagram showing part of the solid-state imaging device pertaining to the first embodiment.

FIG. 2 is a circuit diagram showing part of the solid-state imaging device pertaining to the first embodiment. Specifically, the figure shows a pixel 1, a column amplifier 2, and a noise cancellation circuit 3 in a given column.

The pixel 1 includes a photodiode (PD), a floating diffusion (FD), a reset transistor M11, a transfer transistor M12, an amplification transistor M13, and a selection transistor M14.

The column amplifier 2 includes an input capacitor C1, a load unit (load transistor) M51, a drive unit (drive transistor) M52, a reset unit (reset transistor) M53 and a feedback capacitor C2.

The noise cancellation circuit 3 includes a clamp capacitor Cc, a sample hold capacitor Cs, and a switch transistor M31.

In the solid-state imaging device 10 as described above, both pixel area and peripheral circuit area include transistors.

1-1-2. Structure of Solid-State Imaging Device

Figure 3:
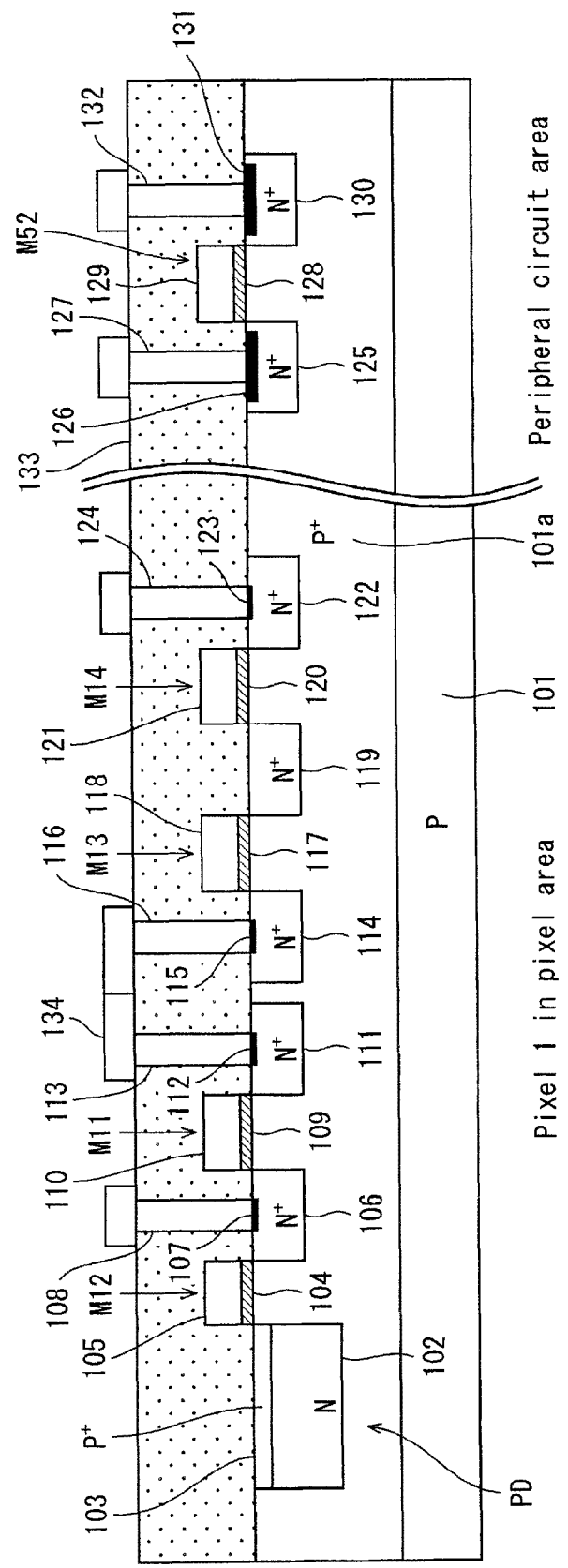
FIG. 3 schematically shows a cross section of the solid-state imaging device pertaining to the first embodiment.

FIG. 3 schematically shows a cross section of the solid-state imaging device pertaining to the first embodiment. Specifically, the figure shows one of the pixels 1 included in the pixel area 11 and one of the transistors (i.e. the drive transistor M52) included in the peripheral circuit area.

As shown in FIG. 3, the solid-state imaging device 10 includes a low concentration p-type semiconductor substrate 101, an insulating film 133 formed over the p-type semiconductor substrate 101, and a wiring layer 134 formed over the insulating film 133.

In the p-type semiconductor substrate 101, a high concentration p-type well region 101a is formed. In the pixel area of the p-type well region 101a, an n-type photoelectric conversion region 102, an n-type FD region 106, and n-type source drain regions 111, 114, 119 and 122 are formed to be separate from each other. On the n-type photoelectric conversion region 102, a high concentration p-type injection region 103 is formed.

Above the p-type channel area sandwiched between the n-type photoelectric conversion region 102 and the n-type FD region 106, a gate electrode 105 is formed on a gate insulating film 104. Here, the n-type photoelectric conversion region 102 serves as the source of the transfer transistor M12, the n-type FD region 106 serves as the drain of the transfer transistor M12, and the gate electrode 105 serves as the gate of the transfer transistor M12.

Above the p-type channel area sandwiched between the n-type FD region 106 and the n-type source drain region 111, a gate electrode 110 is formed on a gate insulating film 109. Here, the n-type FD region 106 serves as the source of the reset transistor M11, the n-type source drain region 111 serves as the drain of the reset transistor M11, and the gate electrode 110 serves as the gate of the reset transistor M11.

Above the p-type channel area sandwiched between the n-type source drain region 114 and the n-type source drain region 119, a gate electrode 118 is formed on a gate insulating film 117. Here, the n-type source drain region 119 serves as the source of the amplification transistor M13, the n-type source drain region 114 serves as the drain of the amplification transistor M13, and the gate electrode 118 serves as the gate of the amplification transistor M13.

Above the p-type channel area sandwiched between the n-type source drain region 119 and the n-type source drain region 122, a gate electrode 121 is formed on a gate insulating film 120. Here, the n-type source drain region 122 serves as the source of the selection transistor M14, the n-type source drain region 119 serves as the drain of the selection transistor M14, and the gate electrode 121 serves as the gate of the selection transistor M14.

A part of the surface of the n-type FD region 106 is silicided. This part (hereinafter called "silicide film 107", which is a nickel silicide film, for example) is in contact with one end of a contact plug 108, which penetrates the insulating film 133. The other end of the contact plug 108 is in contact with the wiring layer 134 formed over the insulating film 133. Here, the width of the silicide film 107 is the same as the width of the contact plug 108.

Similarly, parts of the respective surfaces of the n-type source drain regions 111, 114 and 122 are silicided. These parts (hereinafter called "silicide film 112", "silicide film 115" and "silicide film 123") are in contact with one ends of the corresponding contact plugs 113, 116 and 124, which penetrate the insulating film 133. The other ends of the contact plugs 113, 116 and 124 are in contact with the wiring layer 134 formed over the insulating film 133. Here, the widths of the silicide films 112, 115, and 123 are the same as the widths of the contact plugs 113, 116 and 124, respectively.

The widths of the silicide films formed over the parts of the surfaces the n-type photoelectric conversion region 102, the n-type FD region 106 and the n-type source drain regions 111, 114 and 122 are within the range from 30 nm to 150 nm, preferably from 40 nm to 80 nm. The film thicknesses of the silicide films are within the range from 1 nm to 15 nm, preferably from 1 nm to 10 nm.

In the peripheral circuit area of the p-type well region 101a, an n-type source drain region 125 and an n-type source drain region 130 are formed to be separate from each other.

In the p-type channel area sandwiched between the n-type source drain region 125 and the n-type source drain region 130, a gate electrode 129 is formed on a gate insulating film 128. Here, the n-type source drain region 130 serves as the source of the drive transistor M52, the n-type source drain region 125 serves as the drain of the drive transistor M52, and the gate electrode 129 serves as the gate of the drive transistor M52.

Parts of the surfaces of the n-type source drain regions 125 and 130 are silicided. These parts (hereinafter called "silicide film 126" and "silicide film 131") are in contact with one ends of the corresponding contact plugs 127 and 132, which penetrate the insulating film 133. The other ends of the contact plugs 127 and 132 are in contact with the wiring layer 134 formed over the insulating film 133. The widths of the silicide films 126 and 131 are grater than the widths of the contact plugs 127 and 132, respectively.

The minimum widths of the silicide films formed over the parts of the surfaces of the n-type source drain regions 125 and 130 included in the peripheral circuit area are values obtained by adding a value within the range from 16 nm to 80 nm to the widths of the contact plugs 127 and 132, respectively. Here, the value within the range from 16 nm to 80 nm shows the accuracy of the superposing performed in the lithography process. The film thicknesses of the silicide films are within the range from 20 nm to 50 nm, preferably from 20 nm to 30 nm.

As described above, the first feature of the solid-state imaging device 10 pertaining to this embodiment is that the widths of the silicide films formed over the parts of the surfaces of the n-type photoelectric conversion region 102, the n-type FD region 106 and the n-type source drain regions 111, 114 and 122, contained in the pixel 1, are the same as the widths of the contact plugs formed on the silicide films, respectively.

The second feature is that the film thicknesses of the silicide films formed over the parts of the surfaces of the n-type photoelectric conversion region 102, the n-type FD region 106 and the n-type source drain regions 111, 114 and 122, contained in the pixel 1, are smaller than the film thicknesses of the silicide films formed over the parts of the surfaces of the n-type source drain regions 125 and 130, contained in the peripheral circuit area.

Due to these features of the solid-state imaging device 10, the widths of the silicide films on the n-type photoelectric conversion region 102, the n-type FD region 106 and the n-type source drain regions 111, 114 and 122 can be minimized within the range that maintains the effect of suppressing the contact resistance in the pixel area.

With such a structure, even if a silicide spike is formed in a silicided area, there is only a reduced risk that the spike penetrates the layer where the spike is formed and reaches the p-type well region 101a. As a result, the increase of the leakage current in the pixel area is suppressed, resulting in a high image quality. Meanwhile, when the contact resistance is high, the D range is narrow and it can be a cause of black spots, in the worst case. However, the stated structure reduces the contact resistance and the thermal noise, and thus it maintains the D range.

As described above, the solid-state imaging device 10 suppresses the increase of the leakage current and the contact resistance in the pixel area, at the same time.

In the description above, only one of the pixels 1 in the pixel area 11 is explained. However, note that the other pixels in the pixel area 11 have the same structure. Also, in the description above, only the drive transistor M52 is explained as a representative of the transistors in the peripheral circuit area. However, note that the widths and the film thicknesses of the silicide films of the drive transistor M52 apply to the other transistors in the peripheral circuit area.

1-2. Manufacturing Method For Solid-state Imaging Device

Next, a manufacturing method for the solid-state imaging device is described. FIGS. 4A-4C, 5A-5B and 6A-6B show cross sections of the solid-state imaging device at different steps of the manufacturing method. The left side of each drawing shows the n-type source drain region 125, which is a representative from the n-type source drain regions in the peripheral circuit area. The right side of each drawing shows the n-type source drain region 122, which is a representative from the n-type photoelectric conversion region 102, the n-type FD region 106 and the n-type source drain regions 111, 114 and 122 in the pixel 1 contained in the pixel area.

Figure 4A:
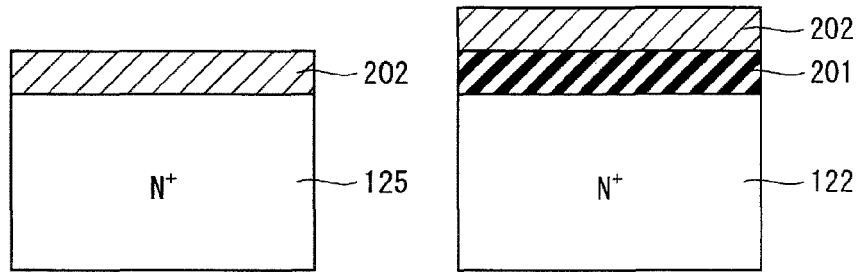
FIGS. 4A-4C show steps of a manufacturing process of a solid-state imaging device.

First, the p-type well region 101a is formed in the p-type semiconductor substrate 101, and then the n-type source drain region 122 and the n-type source drain region 125 are formed in the pixel area and the peripheral circuit area of the p-type well region 101a, respectively (This step is not illustrated). Next, as shown in FIG. 4A, a silicide block film (e.g. silicone oxide film) 201 is formed over the n-type source drain region 122 in the pixel area, and then a first metal film (e.g. Ni film) 202 is formed over the silicide block film 201 and the n-type source drain region 125 in the peripheral circuit area. Here, the film thickness of the Ni film 202 is in the range from 5 nm to 15 nm, preferably from 8 nm to 13 nm.

Figure 4B:
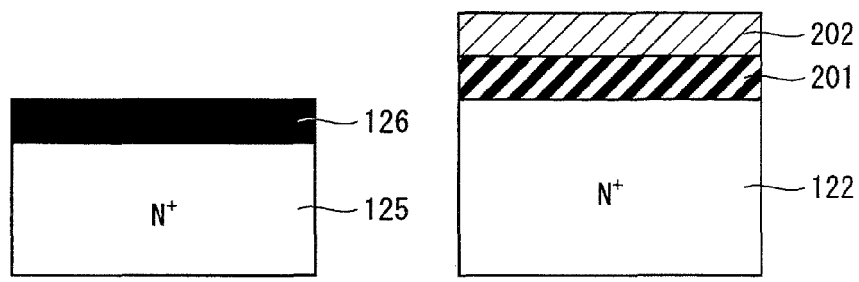

Next, the p-type semiconductor substrate 101 (not illustrated) is subjected to heat treatment. As a result, the surface of the n-type source drain region 125 in the peripheral circuit area is silicided as shown in FIG. 4B (The silicided surface is hereinafter called "Ni silicide film 126). On the other hand, the silicide block film 201 has been formed over the n-type source drain region 122 in the pixel area. This prevents Ni atoms from being dispersed to the n-type source drain region 122. As a result, the n-type source drain region 122 in the pixel area is not silicided, and only the n-type source drain region 125 in the peripheral circuit area is silicided. Here, it is preferable that the film thickness of the Ni silicide film 126 to be formed is several tens of nanometers.

Figure 4C:
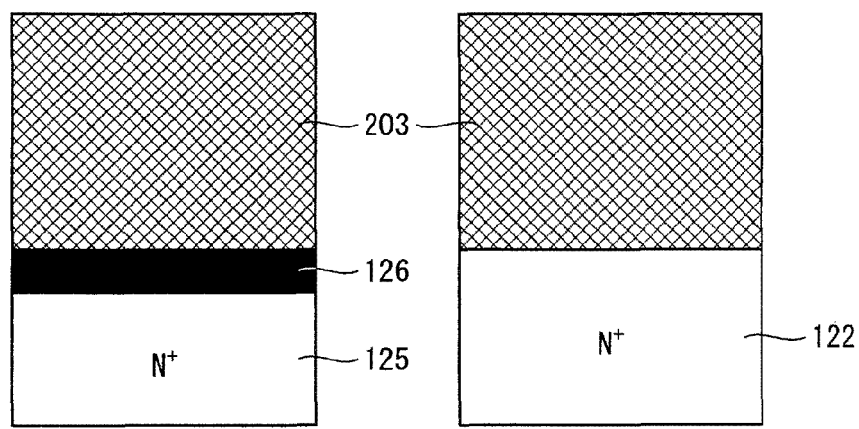

Next, the residue of the Ni film 202, which is left unreacted, and the silicide block film 201 are removed. After that, an insulating film 203, which is made of silicon oxide film for example, is layered on the p-type semiconductor substrate 101 (not illustrated), as shown in FIG. 4C. Specifically, the insulating film 203 is formed over the Ni silicide film 126 on the n-type source drain region 125 and the n-type source drain region 126. Then, the surface of the insulating film 203 is planarized by CMP (Chemical Mechanical Polishing) method, for example.

Figure 5A:
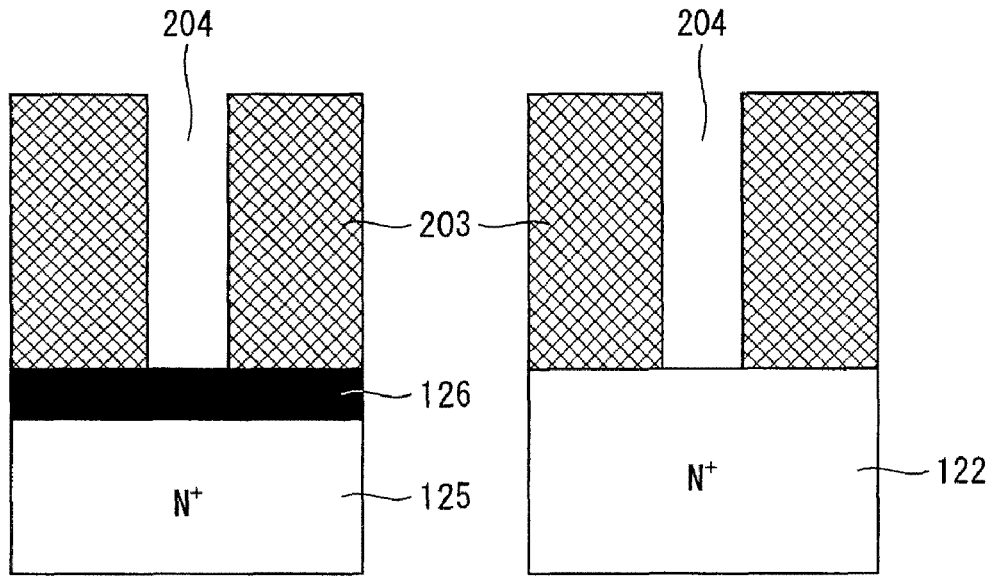
FIGS. 5A-5B show steps of the manufacturing process of a solid-state imaging device, following the steps shown in FIGS. 4A-4C.
Figure 5B:
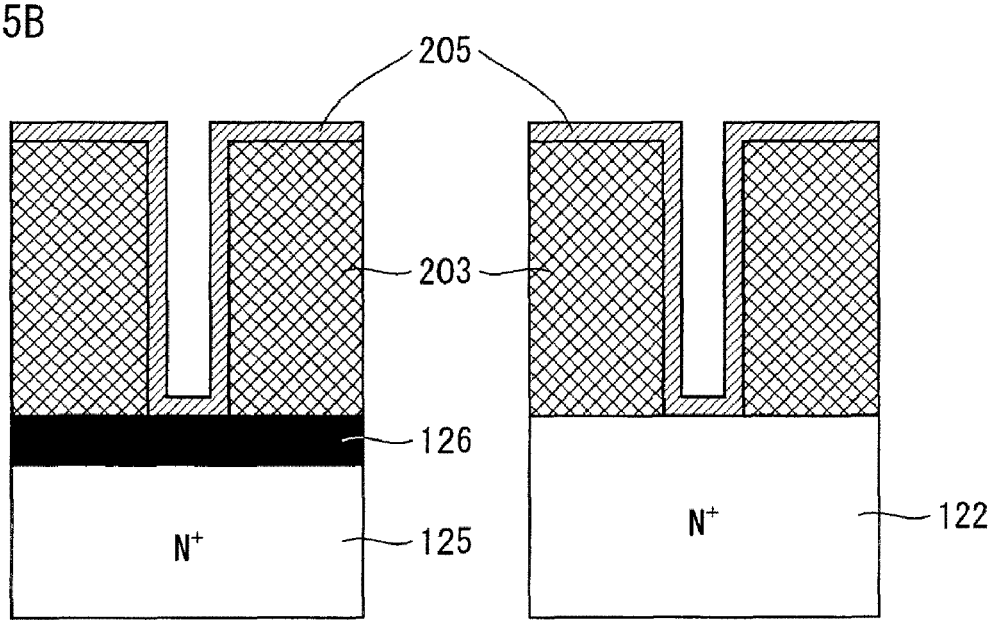

Next, as shown in FIG. 5A, the insulating film 203 is partially removed by etching, and thus contact holes 204 are formed. After that, as shown in FIG. 5B, a second metal film (e.g. Ni film) 205 is formed by sputtering method for example, such that the inside surfaces and the bottom surfaces of the contact holes 204 are covered with the films. Here, the film thickness of the second metal film 205 is in the range from 1 nm to 10 nm, preferably from 1 nm to 5 nm.

Next, the p-type semiconductor substrate 101 (not illustrated) is subjected to heat treatment. As a result, the surface of the n-type source drain region 122, which is exposed through the contact hole 122, is silicided. At this step, the insulating film 203 functions as a mask. Thus, the Ni silicide film 123 is formed in a manner like a self-alignment process. Since the Ni film 205 has been formed only on the area that is exposed through the contact hole 204, the width of the Ni silicide film 123 will be the same as the width of the contact hole 204. Here, it is preferable that the film thickness of the Ni silicide film 123 to be formed is approximately 10 nm.

Meanwhile, the surface of the n-type source drain region 125 exposed through the contact hole 204 has already been silicided. Thus, in comparison with the n-type source drain region 122, the Ni film 205 does not cause a strong chemical reaction.

Figure 6A:
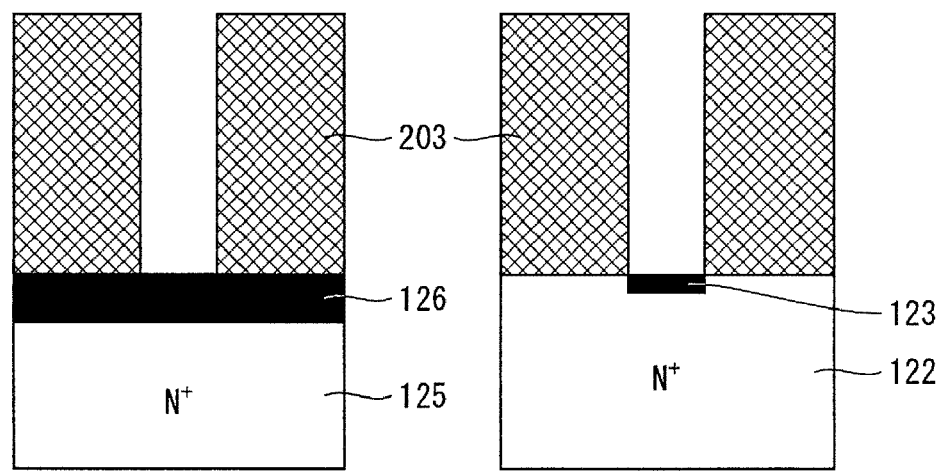
FIGS. 6A-6B show steps of the manufacturing process of a solid-state imaging device, following the steps shown in FIGS. 5A-5B.

After that, the residue of the Ni film 205, which is left unreacted, is removed. The result is as shown in FIG. 6A.

Figure 6B:
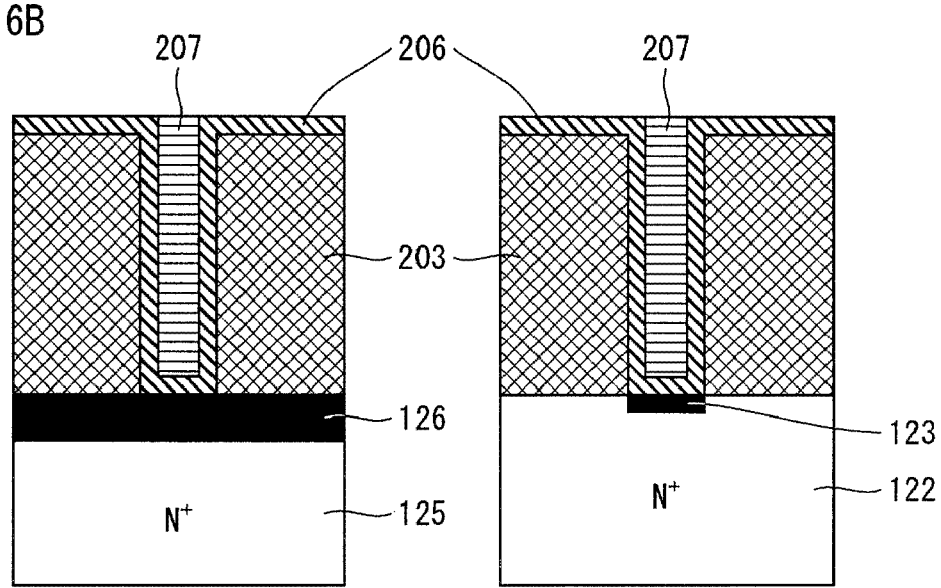

Finally, as shown in FIG. 6B, a Ti film and a TiN film are layered by the sputtering method and by the MOCVD method respectively, such that the inside surfaces and the bottom surfaces of the contact holes 204 are covered with the films. As a result, an adhesion layer 206, which is made from the Ti film and the TiN film, is formed. After that, tungsten (i.e. a conductive material) 207 is implanted in the contact holes 204 by the CVD method. In this way, the contact plugs are formed.

Through the steps described above, silicide films having the same width as the contact plugs are formed in the pixel area.

Here, in the silicidation with a metal performed on the surfaces of the n-type photoelectric conversion region 102, the n-type FD region 106 and the n-type source drain regions 111, 114 and 122 in the pixel area, some of the metal atoms disperse in the width (horizontal) direction of the regions to be silicided. Thus, the silicided film will practically be wider than the contact plug. Note that such a difference is ignored in this Description. Specifically, the width of the silicide film and the width of the contact plug are regarded as the same as long as their difference does not exceed 10 nm.

Next, a description is given of the case of microfabrication, in which thin gate wires with a gate length of no greater than 80 nm are used, is adopted in the peripheral circuit area. In this case, the silicided thin gate wires might be broken when the heat treatment after the silicidation process is performed at 600° C. or higher. Thus, it is not preferable that Ti is used in the second metal film 205. This is because Ti requires heating at 600° C. or higher to be silicided.

In the case where microfabrication is adopted in the peripheral circuit area, it is preferable that Ni or NiPt is used in the second metal film 205 in the pixel area. This is because the second metal film 205 with such a structure requires heating at no higher than 300° C. to be silicided. This realizes silicidation of the second metal film 205 in the pixel area without breaking the silicided thin gate wires on the peripheral circuits.

Modification Examples

Figure 7A:
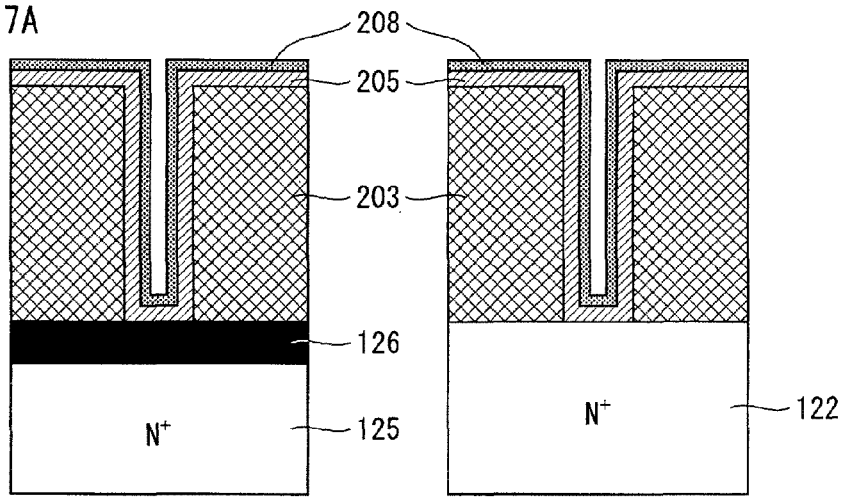
FIGS. 7A-7C show steps of a manufacturing process of a solid-state imaging device pertaining to a modification example.
Figure 7B:
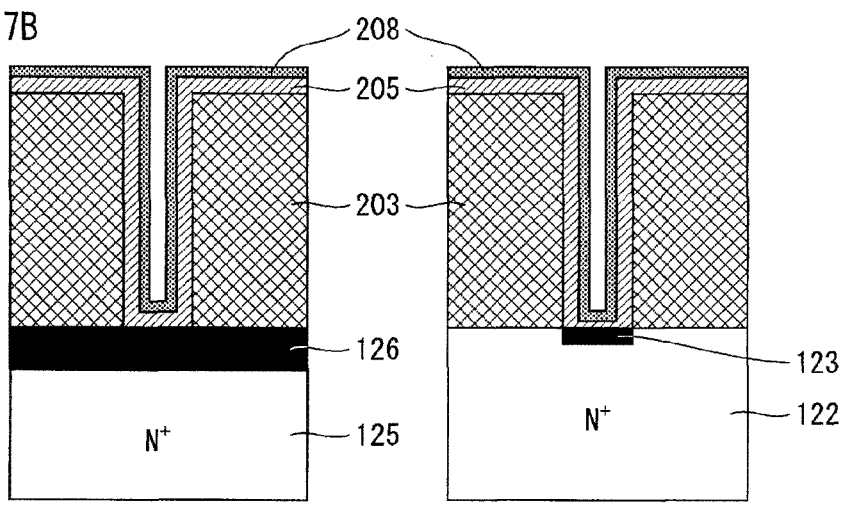
Figure 7C:
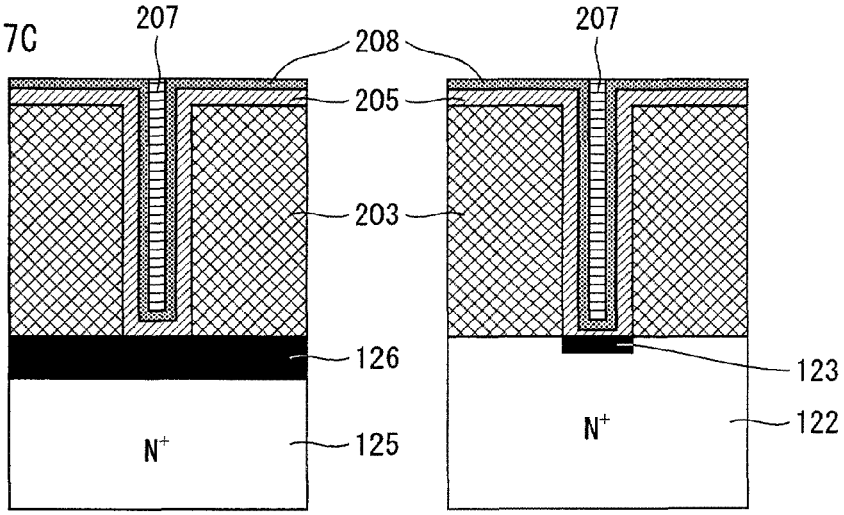

The following describes a modification example of the manufacturing method. The steps shown from FIG. 4A to FIG. 5B are the same as the first embodiment. Thus, only the steps following them are described here. FIGS. 7A to 7C show cross sections of the solid-state imaging device at the steps following FIG. 5B. According to the manufacturing method described above, after the Ni film 205 is formed in the step shown in FIG. 5B, the p-type semiconductor substrate 101 is subjected to heat treatment in the step shown in FIG. 6A. According to this modification example, however, after the Ni film 205 is formed, a TiN film 208 is further formed over the Ni film 205, as shown in FIG. 7A.

After that, the p-type semiconductor substrate, which is not illustrated, is subjected to heat treatment. As a result, the surface of the n-type source drain region 122 exposed through the contact hole 204 is silicided, and thus the Ni silicide film 123 is formed as shown in FIG. 7B.

Finally, as shown in FIG. 7C, tungsten (i.e. a conductive material) 207 is implanted in the contact holes 204 by the CVD method. In this way, the contact plugs are formed. The contact plugs are therefore formed over the adhesion layer made from the Ni film 205 and the TiN film 208 in the contact holes 204.

With the stated process, the step of removing the residue of the Ni film 205, which is left unreacted, can be omitted.

Supplemental Descriptions

The solid-state imaging device pertaining to the present invention is described above based on the embodiment. However, as a matter of course, the present invention is not limited to the embodiment.

(1) According to the embodiment above, the Ni silicide film 126 and the Ni silicide film 123 are made from the same material. Alternatively, at least one of these films may be made from a different material. For example, an NiPt silicide film may be formed instead of the Ni Silicide film. If this is the case, an NiPt film is formed instead of the Ni film (i.e. the second metal film), on the inside surfaces and the bottom surfaces of the contact holes 204.

(2) According to the embodiment above, Ni silicide films are formed. Alternatively, a Co (i.e. cobalt) silicide film, a Fe (i.e. iron) silicide film, a Ti (i.e. titanium) silicide film, an Mg (i.e. magnesium) silicide film, a W (i.e. tungsten) silicide film, a Pd (i.e. palladium) silicide film, a Pt (i.e. platinum) silicide film, or the like may be formed instead of the Ni silicide film.

(3) The circuit configurations shown in FIG. 1 and FIG. 2 are only examples. Other configurations may be adopted.

(4) According to the embodiment above, the p-type well region 101a is formed in the p-type semiconductor substrate 101. However, instead of the p-type well region 101a, an n-type source drain region or the like may be formed in the p-type semiconductor substrate 101.

INDUSTRIAL APPLICABILITY

The present invention is applicable to various devices, such as digital cameras.

REFERENCE SIGNS LIST 1 pixel
2 column amplifier
3 noise cancellation circuit
4 switch element
5 load circuit
10 solid-state imaging device
11 pixel area
12 column amplifiers
13 noise cancellation circuits
14 multiplexer
15 load circuits
16 horizontal scanning circuit
17 output amplifier
18 vertical scanning circuit
19 voltage generation circuit
20 timing control unit

The invention claimed is:

1. A MOS solid-state imaging device comprising:
a semiconductor substrate provided with a pair of source and drain regions in a pixel area thereof, the pair of source and drain regions constituting part of a transistor in the pixel area;
an insulating film formed over the semiconductor substrate;
a wiring layer formed over the insulating film; and
a contact plug penetrating through the insulating film to connect either one of the pair of source and drain regions with the wiring layer, wherein
a surface area of said one of the pair of source and drain regions is silicided, the surface area contacting with the contact plug, and
a width of the surface area is equal to a width of the contact plug, and
wherein the semiconductor substrate is further provided with another pair of source and drain regions in a peripheral circuit area around the pixel area, the other pair of source and drain regions constituting part of another transistor in the peripheral circuit area,
the MOS solid-state imaging device further comprises another contact plug penetrating through the insulating film to connect either one of the other pair of source and drain regions with the wiring layer,
a surface area of said one of the other pair of source and drain regions is silicided, the surface area contacting with the other contact plug, and
a thickness of the surface area contacting with the contact plug is less than a thickness of the surface area contacting with the other contact plug.

2. The MOS solid-state imaging device of claim 1, wherein the surface area contacting with the contact plug and the surface area contacting with the other contact plug are nickel silicide areas.

3. A manufacturing method for a MOS solid-state imaging device, comprising:
a first step of forming, in a pixel area of a semiconductor substrate, a first pair of source and drain regions of a first transistor, while forming, in a peripheral circuit area around the pixel area, a second pair of source and drain regions of a second transistor;
a second step of forming a silicide block film over the pixel area of the semiconductor substrate;
a third step of forming a first metal film over the semiconductor substrate to cover the silicide block film;
a fourth step of causing silicidation on a surface of at least one of the second pair of source and drain regions of the second transistor, by subjecting the semiconductor substrate to heat treatment;
a fifth step of forming an insulating film over the semiconductor substrate after removing a residue of the first metal film and the silicide block film;
a sixth step of forming a first contact hole in the insulating film above said at least one of the first pair of source and drain regions, while forming a second contact hole in the insulating film above said at least one of the second pair of source and drain regions;
a seventh step of forming a second metal film over an inner surface of the first contact hole and an inner surface of the second contact hole;
an eighth step of subjecting the semiconductor substrate to heat treatment to silicide a first surface area of said at least one of the first pair of source and drain regions, the first surface area exposed through the first contact hole, and to silicide a second surface area of said at least one of the second pair of source and drain regions, the second surface area exposed through the second contact hole; and
a ninth step of forming a first contact plug contacting with the first surface area by implanting a conductive material into the first contact hole, while forming a second contact plug contacting with the second surface area by implanting a conductive material into the second contact hole, after removing a residue of the second metal film.

* * * * *